United States Patent [19]

Wheeler et al.

[11] Patent Number: 4,597,708
[45] Date of Patent: Jul. 1, 1986

[54] WAFER HANDLING APPARATUS

[75] Inventors: William R. Wheeler, Saratoga; Rusmin Kudinar, Fremont; George J. Kren, Los Altos; David D. Clementson, Palo Alto, all of Calif.

[73] Assignee: Tencor Instruments, Mountain View, Calif.

[21] Appl. No.: 616,979

[22] Filed: Jun. 4, 1984

[51] Int. Cl.[4] .............................................. B65G 1/06
[52] U.S. Cl. ..................................... 414/331; 74/102; 74/107; 414/416; 414/744 B; 414/752
[58] Field of Search .................. 414/331, 416, 744 R, 414/744 A, 744 B, 744 C, 752; 198/365; 74/102, 104, 107; 105/156

[56] References Cited

U.S. PATENT DOCUMENTS

| | | | |
|---|---|---|---|
| 3,834,555 | 9/1974 | Bennington et al. | 414/744 B |
| 4,004,681 | 1/1977 | Clewett et al. | 198/365 X |
| 4,342,535 | 8/1982 | Bartlett et al. | 414/744 A |
| 4,388,034 | 6/1983 | Takahashi | 414/331 |
| 4,501,527 | 2/1985 | Jacoby et al. | 414/744 B |
| 4,509,635 | 4/1985 | Emsley et al. | 198/365 |

Primary Examiner—Robert J. Spar
Assistant Examiner—Stuart J. Millman
Attorney, Agent, or Firm—Thomas Schneck

[57] ABSTRACT

A wafer handler featuring a carriage movable along a rail path, the carriage supporting an upright rotatable arm with a cantilevered wafer chuck. Elevators for raising and lowering trays containing wafer stacks are disposed on either side of the rail path. Each elevator has a curved track section which may be interposed along the rail path. The upright arm has a track follower, parallel to a boom supporting the wafer chuck and freely movable along the rail path, except when it encounters a curved track section. In this instance, the track follower will follow the curved track section, causing rotation of the arm, boom and wafer chuck, bringing the chuck into the wafer stack at an elevation determined by the elevator. In this manner, motion in the X, Y and Z planes may be provided for stacked wafers over extended distances.

15 Claims, 11 Drawing Figures

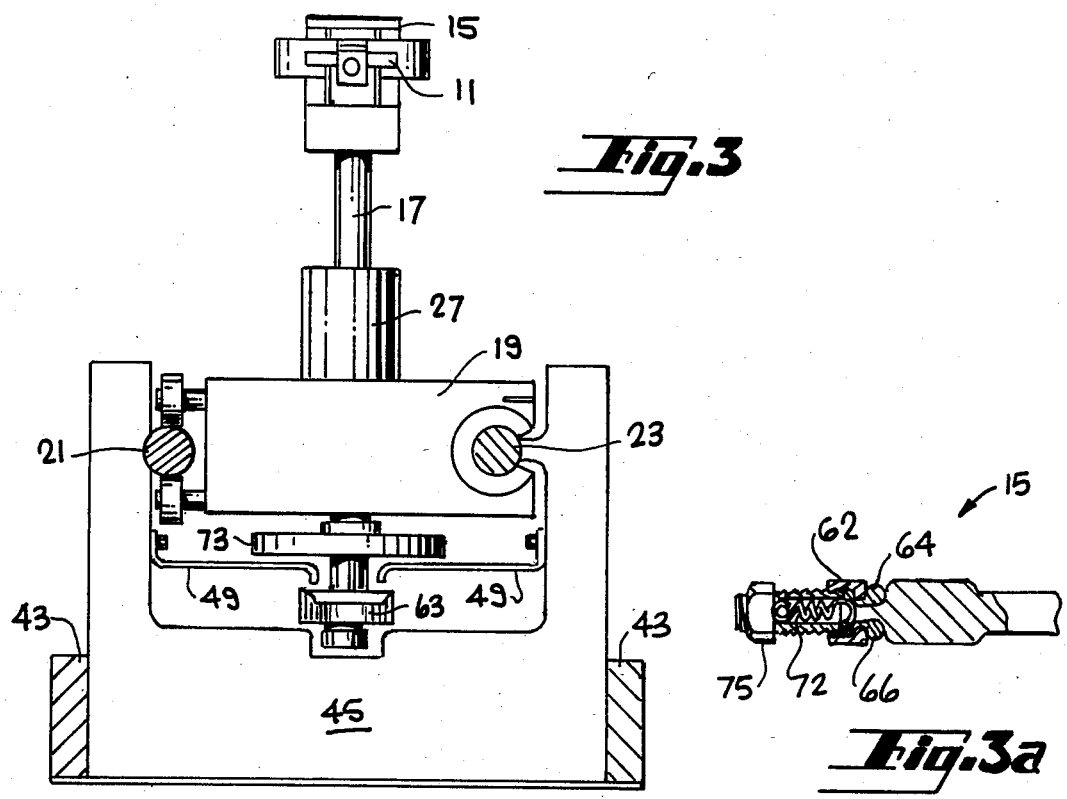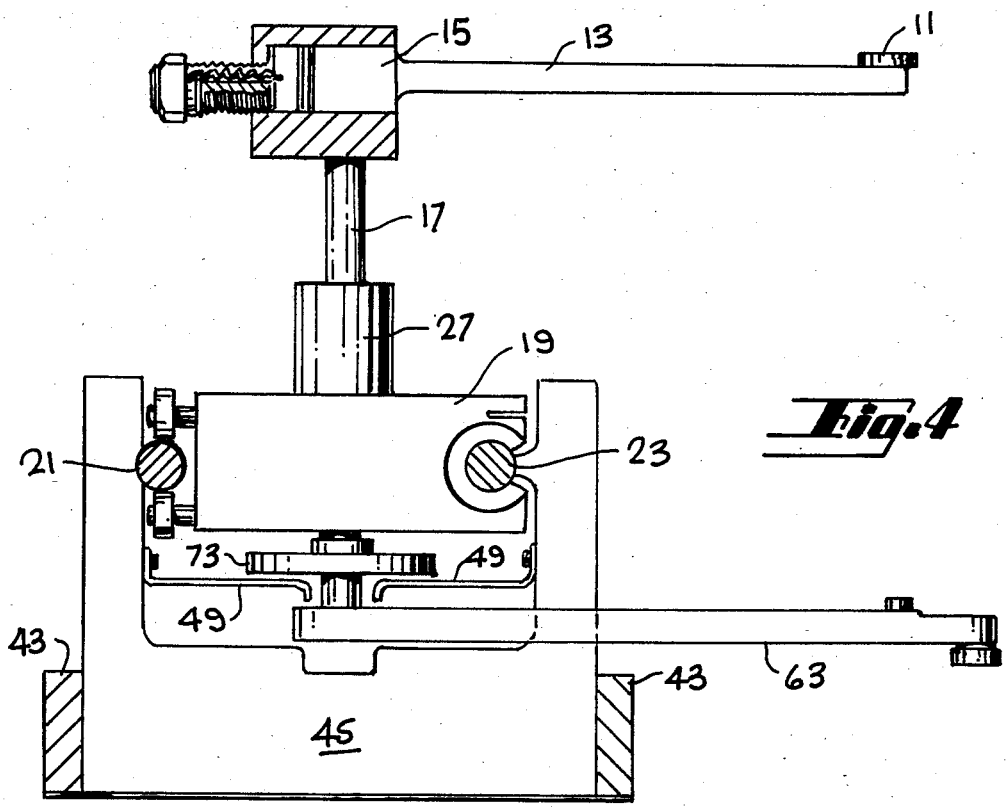

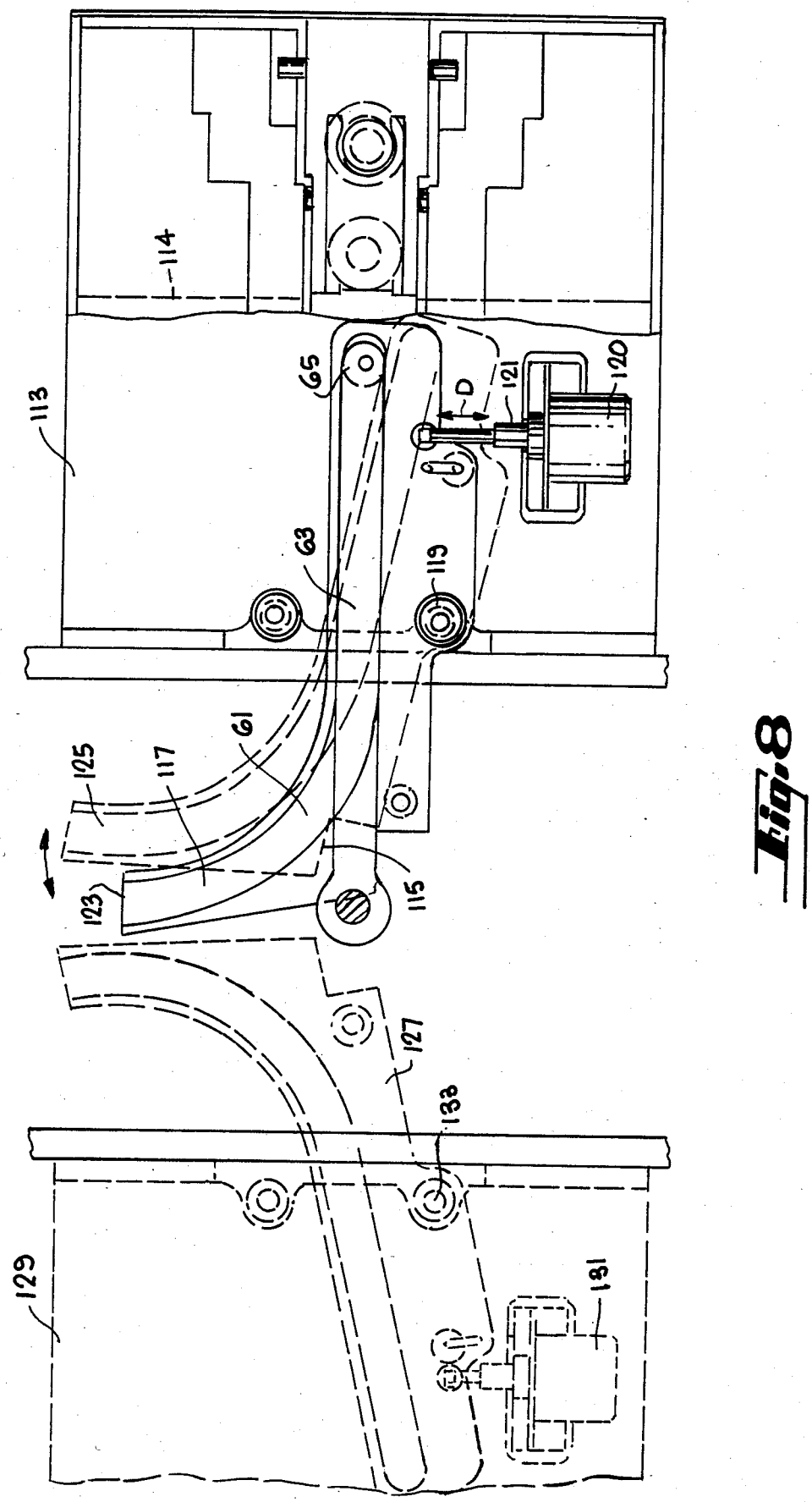

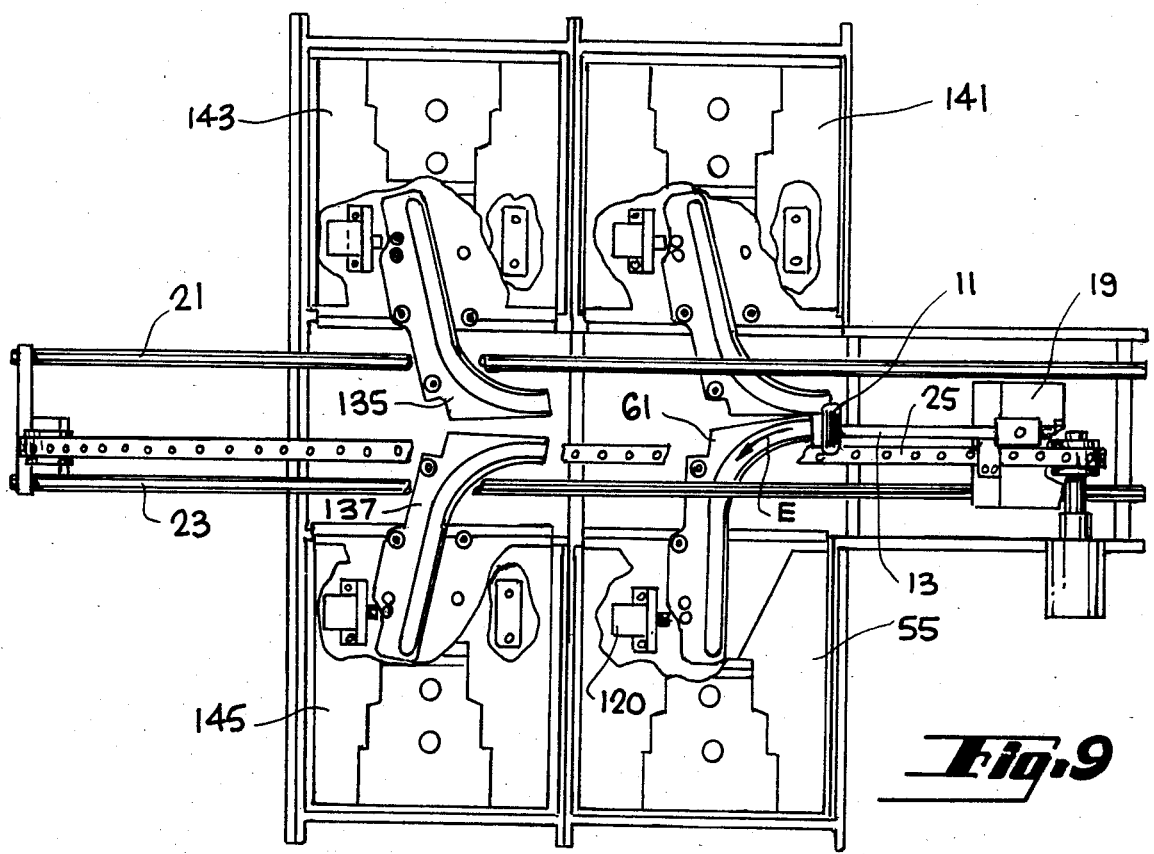
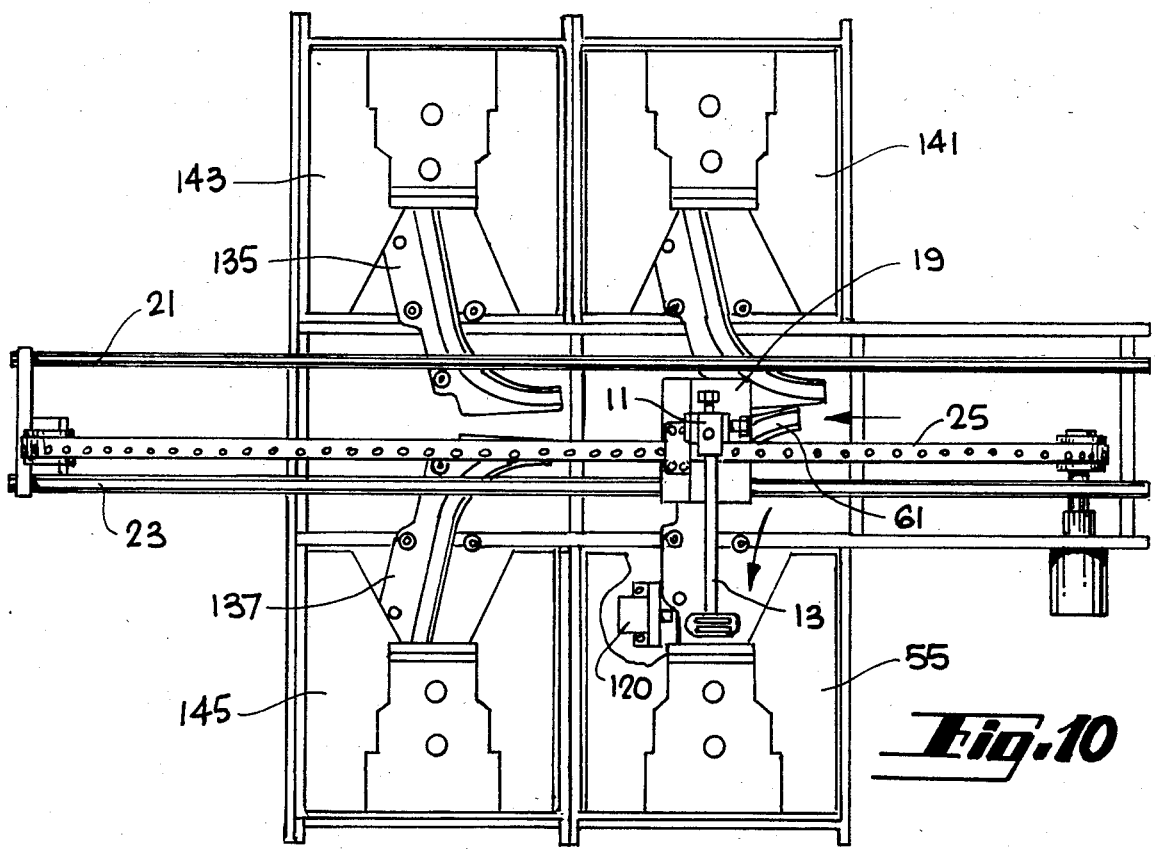

WAFER HANDLING APPARATUS

TECHNICAL FIELD

The invention relates to article handling apparatus, especially to an apparatus for handling or manipulating flat articles, such as wafers or disks.

BACKGROUND ART

Presently, there are five principal means for moving wafers in the semiconductor industry. These include: air tracks, vacuum chucks, belts, ultrasonic devices and robotic arms. As the industry attempts to build increasingly larger circuits, using very large scale integration (VLSI), there are ever more stringent requirements for cleanliness. Individual particles of dirt have the potential of running an individual circuit die. In VLSI circuits, this may represent a significant loss. Both air tracks and belts tend to transfer an undesirable amount of particulate matter to wafers. Vacuum chucks, ultrasonic devices and robotic arms may be satisfactory for wafer handling over short distances.

An object of the invention is to provide a wafer handling apparatus which maintains wafers free from particulate contamination, yet which is able to move wafers over the distances usually associated with belts and air tracks.

DISCLOSURE OF THE INVENTION

The above object has been achieved with a wafer handling apparatus featuring a wafer chuck supported on a carriage movable over a path defined by a track or guide. The chuck is mounted on a boom, adapted for rotation through an upright arm and a track follower member, parallel to the boom but spaced apart. Rotation of the boom is caused by curved track sections which may be removably positioned in and out of the path, similar to rail sidings switched into railroad tracks. The track follower member, such as a wheel, will follow the track, causing rotation of the boom whenever a curved section is encountered.

Wafer elevators are disposed adjacent to the path and are associated with the curved track sections. These sections are selectably interposed in the path to bring the wafer chuck to the elevator location by means of boom rotation. The elevator supports a wafer carrier, carrying wafers in a spaced relation with spacing large enough to permit the wafer chuck to remove a desired wafer from the carrier.

The carriage is powered by a belt extending the length of the path. As the belt pulls the carriage past a wafer elevator, a curved track section may be interposed in the path so that a track follower engages the curved track section, causing a connected boom to rotate, bringing the wafer chuck to the elevator where a wafer may be deposited or picked up.

The wafer handling apparatus of the present invention does not deposit particulates on wafers, as did belt and air track systems of the prior art, yet can move wafers over the distances usually associated with belt and air track systems.

BRIEF DESCRIPTION OF THE DRAWINGS

FIGS. 3 and 4 illustrate frontal views of a wafer chuck, boom and support arm mounted on a carriage.

FIG. 3a is a top view of a joint detail of the wafer boom and support arm shown in FIGS. 3 and 4.

FIG. 8 is a view of curved track sections insertable in a path over which the arm supporting the wafer track travels.

FIGS. 9 and 10 are top views showing the operation of the curved track sections intercepting the support arm.

BEST MODE FOR CARRYING OUT THE INVENTION

Figure 1:
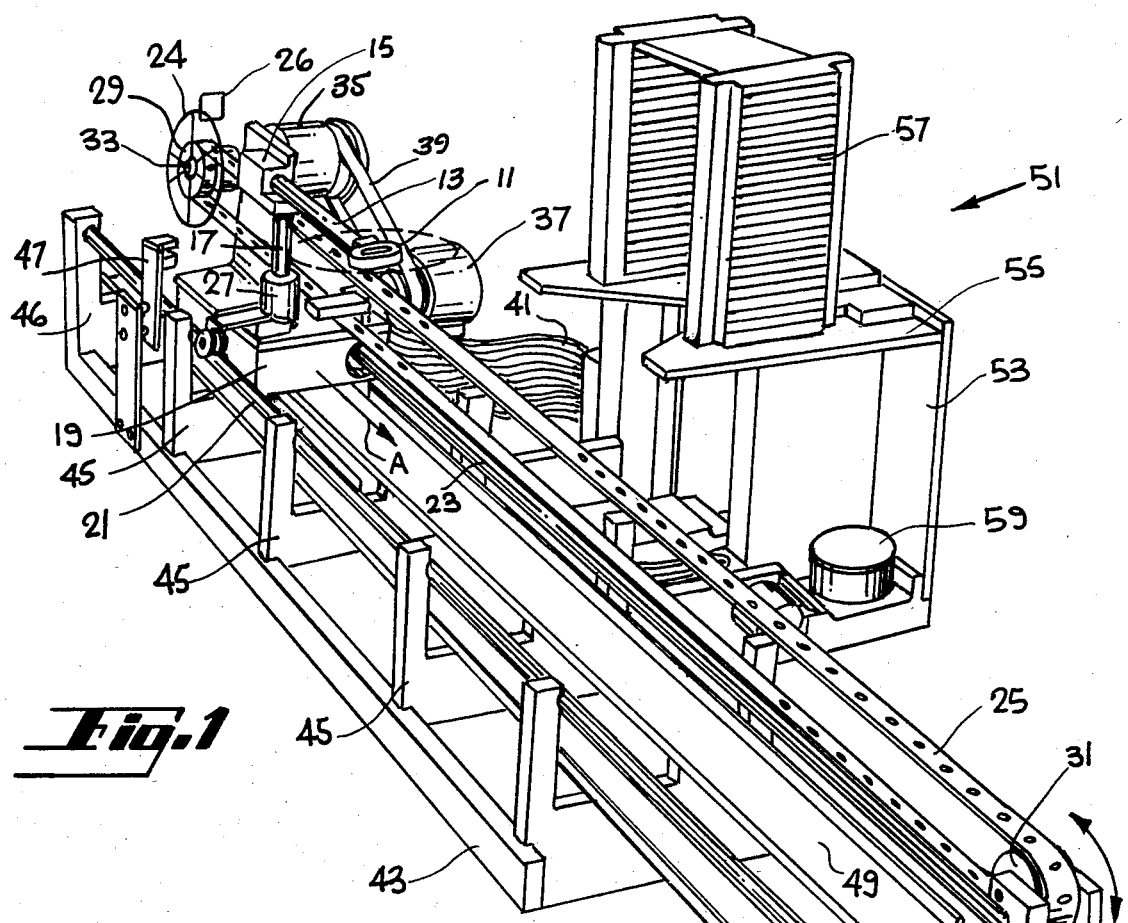
FIG. 1 is a perspective of a wafer handling apparatus in accord with the present invention.
Figure 2:
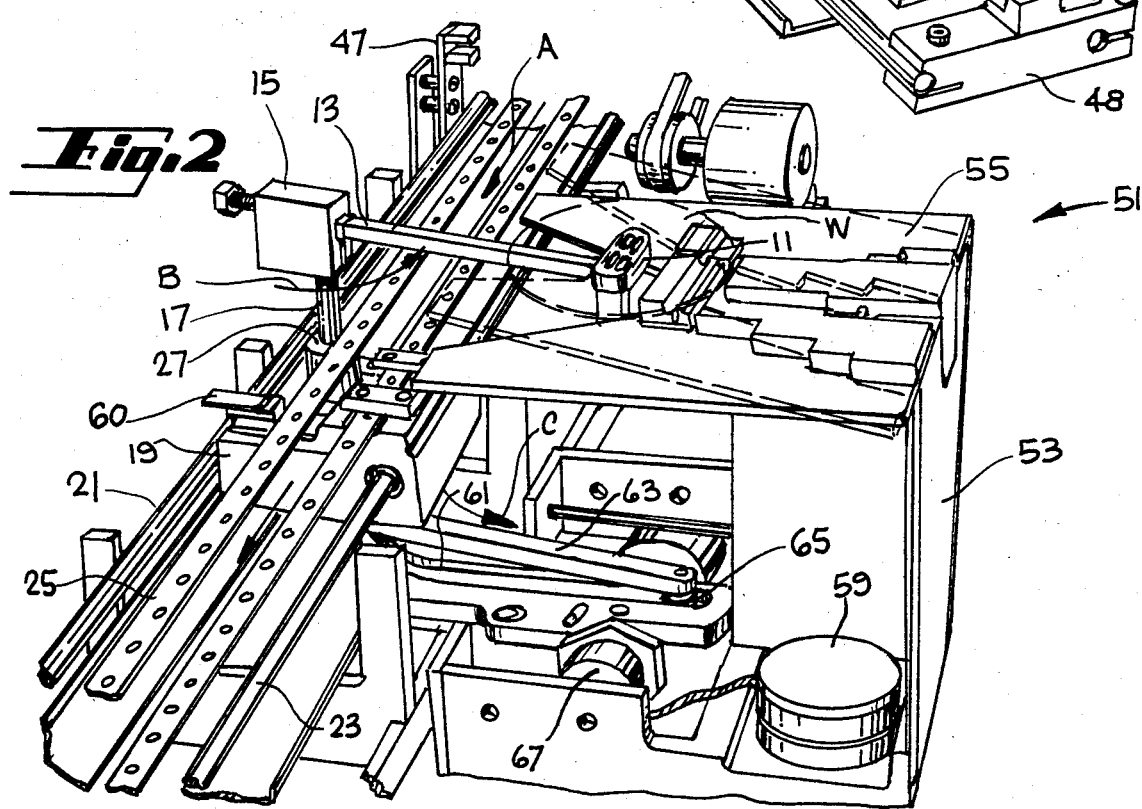
FIG. 2 is a perspective view of a wafer transfer station used with the wafer handling apparatus illustrated in FIG. 1.

With reference to FIGS. 1 and 2, a wafer chuck 11 is supported by a boom 13 which is horizontally disposed, cantilevering the chuck from a joint 15. Wafer chuck 11 is a vacuum chuck having lines within the boom 13 extending toward joint 15 and then downwardly through upright arm 17. The upright arm provides a vertical access of rotation. Turning of arm 17 causes rotation of wafer chuck 11 about an origin centered on the axis of the arm.

Arm 17 is supported, in turn, by a carriage 19 which rides on rails 21 and 23. Carriage 19 has wheels or rollers which are supported on the rails so that the carriage freely slides along as the carriage is driven by belt 25 which is affixed to the carriage. Belt 25 is a metal ribbon belt having equally spaced holes therein for sprocket drive, similar to a bicycle chain.

Carriage 19 is a block of metal which may be solid or hollow. The carriage allows upright arm 17 to pass therethrough. A sleeve 27 is rigidly connected to the carriage, but allows rotation of arm 17 within the sleeve by means of a rotary bearing contained within the sleeve. Belt 25 is trained about a drive sprocket 29 and an idler pulley 31 at an opposite end of the belt. A drive shaft 33 passes through drive sprocket 29 to gear box 35 which receives power from motor 37 by means of power belt 39. Motor 37 is a stepper motor under digital control over cable 41. The motor can drive the main belt 25 to a precise location once a command is issued by a digital source, such as a computer.

A frame 43 has upright members 45 contacting rails 21 and 23. The upright members have detents or grooves for positioning the rails at the desired height. Frame end members 46 and 48 provide support for the rails. Rails 21 and 23 may have any desired length, allowing carriage 19 to move over long distances. The rails need not be straight, but may have curvature, similar to railroad rails, so long as the carriage can follow the rail curvature. The movable carriage of the present invention provides a means for cleanly moving wafers over long distances, even longer than associated with belts or air tracks. Tray 49 supports pneumatic lines which supply vacuum pressure to the wafer chuck. The tray is positioned below the carriage, but above the track follower guide means described below. Carriage 19 rides on rails 21 and 23 using rolling support members, such as wheels or roller bearings. Frame 43 also supports position sensors, such as optical switch 47, which reports passage of the carriage past the switch. An extension from the carriage 19, such as a specially provided finger 60, seen in FIG. 2, passes through the optical switch 47 so that the arrival of the carriage near the end of the rails is known and the direction of the motor driving the carriage through belt 25 can be reversed.

Returning to FIG. 1, the end of the rails, near optical switch 47, is known as the house position. On power-up, the carriage 19 is sent to the home position. Optical encoder 24 measures pulley rotation and reports rotation, through a transducer 26, relative to the home position. Pulley rotation is electrically converted to linear belt motion so that the location of carriage 19 is known at all times while power is on. When the carriage is dispatched to a new location, the dispatching signal drives motor 37 until a desired count is reached in the optical encoder, representing a corresponding distance.

Alongside the rails, a wafer transfer station 51 is located. The wafer transfer station includes a wafer elevator 53 having a platform 55, supporting a wafer carrier 57. The wafer carrier may be any of the standard carriers known in the industry which serve to carry wafer stacks from one location to another in spaced, parallel alignment. An elevator motor 59 drives a screw which controls the position of platform 55. By vertical motion of platform 55, wafers within the wafer carrier 57 may be accessed in succession by wafer chuck 11. Similarly, any empty slot within the tray may be skipped by appropriate motion of the platform.

Seen for the first time in FIG. 2 is a curved track section 61 which resides beneath the path traveled by carriage 19. The curved track section forms part of a guide means which includes a track follower member 63. This member has a wheel 65 riding in a groove in the center of the curved track section 61. As the carriage is moved along the length of the rails in the direction indicated by arrow A, the track follower member 63 may encounter curved track section 61. If it does, the track follower member, normally parallel to the path defined by rails 21 and 23, will now be forced to rotate to a direction which is approximately perpendicular to that path. Since upright arm 17 is connected to track follower member 63, the turning of the track follower member causes rotation of upright arm 17 in the direction indicated by arrow B. Such rotation may bring a wafer, W, supported by wafer chuck 11 into a position over the platform 55 since boom 13 is connected to arm 17 and maintained parallel to track follower member 63. The curved track section can be caused to intercept the track follower member by means of a linear motor 67. Proper positioning of the curved track section by means of the motor causes the track follower member 63 to follow the curved arrow C.

In FIGS. 3 and 4, frame 43 is seen supporting upright member 45 which, in turn, positions rails 21 and 23, as well as tray 49. Upright arm 17 is seen to pass through sleeve 27 and through carriage 19, emerging from the bottom of carriage 19. Cam 73 has a detent to establish a reference position for upright arm 17. This allows arm 13 to be carried in alignment with the rails when not rotated by a curved track section. Joint 15 is seen supporting the wafer chuck 11 which is traveling forwardly, in alignment with the linear track follower member 63. In FIG. 4, the track follower member 63 is seen at right angles to the direction of motion of the carriage, causing boom 13 to also be at right angles to the direction of motion since both the track follower member 63 and the boom 13 are connected to upright arm 17.

The joint 15 allows boom 13 to rotate in a horizontal plane. Besides the angular rotation of the boom upon track follower encounter with a curved track section, the boom is able to pivot by a few degrees with no follower lateral motion. As seen in FIG. 3a, this deliberately provided play arises because the joint 15 has a spur 62 pivotally mounted between two pins 64 and 66. Spur 62 is connected to an anchor 75 by means of a spring 72. This feature is a safety measure intended to prevent high pressure contact with or by wafers. This provides for gentle handling of wafers by preventing high pressure contact with the edge of the wafer against the carrier.

Figure 5:
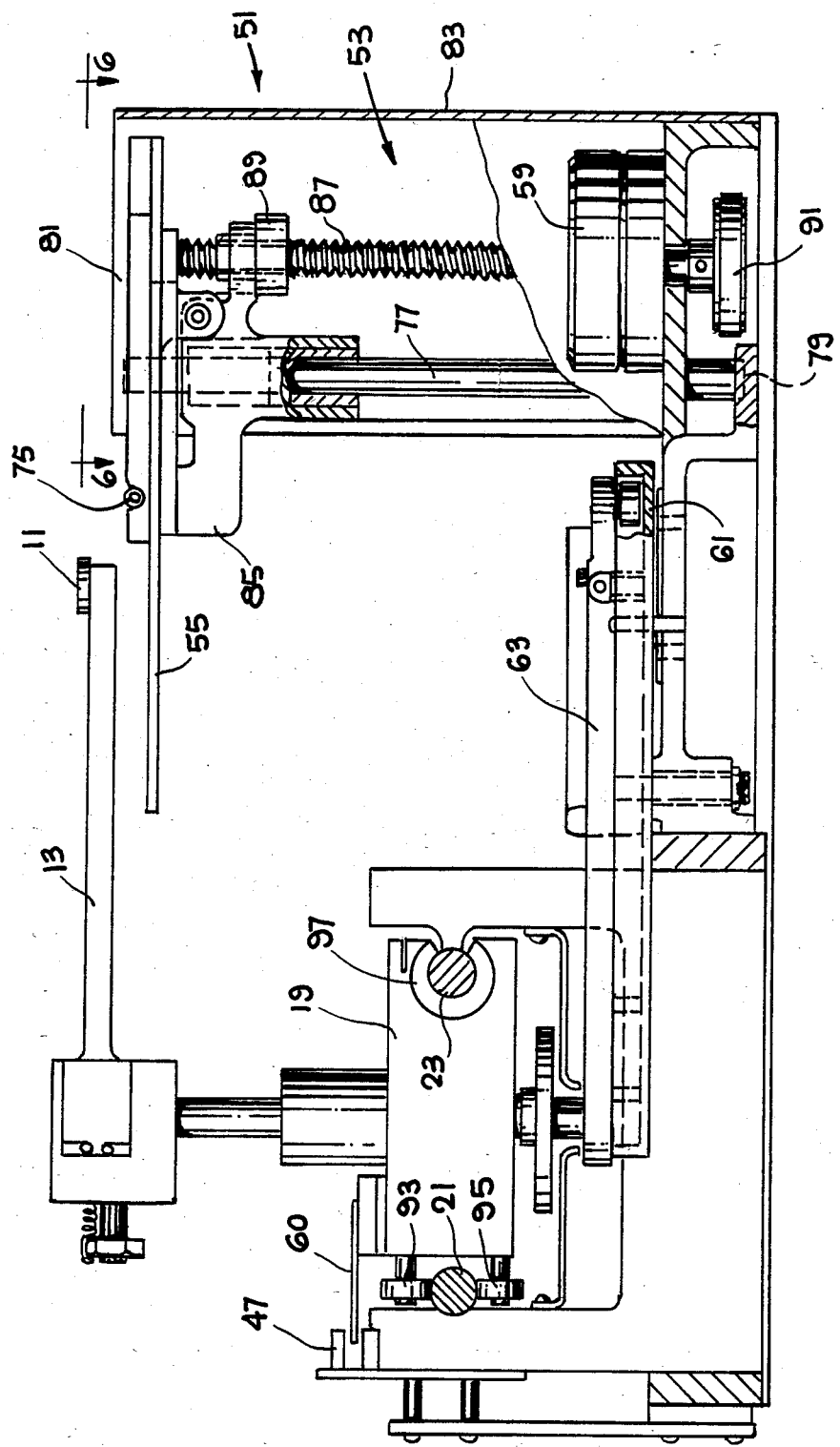
FIG. 5 is a side sectional view taken along lines 5—5 in FIG. 2.

With reference to FIG. 5, boom 13 may be seen supporting wafer chuck 11 over platform 55. A wafer carrier is normally seated on the platform, with proper registration being made by means of seating grooves 75. The height of the platform is adjusted by means of an elevator 53. Such an elevator comprises an upright shaft 77 secured to a frame including a base 79 and a tie block 81, both the base and the tie block connected by means of an upright panel 83. A sleeve 85 is connected to platform 55 on one side and on the other side, the sleeve 85 is connected to a screw 87. The screw carries threaded nut 89 connected to sleeve 85 for providing vertical motion thereto. Elevator motor 59 provides power through a toothed belt to a drive pulley 91 having a central axis transferring rotary power to screw 87 so that platform 55 can be raised and lowered. Motor 59 may be a stepper motor for accurate digital control of the platform elevation. The elevation is coordinated with the known position of wafer chuck 11. Track follower member 63 is seen within a curved track section 61 causing the boom to be extended into the notch of the platform. Carriage 19 has been stopped opposite the wafer transfer station 51 for wafer loading from or unloading. The carriage, riding on rails 21 and 23 utilizing wheels 93 and 95 on one side and using a linear ball bushing 97 on the other side, is driven by a belt pulling the carriage longitudinally in the same direction as rails 21 and 23. The position of the carriage is known, both by counting stepper motor pulses and by periodically checking the position of the carriage by means of sensors, such as optical sensor 47 and finger 60, extending from the carriage into the optical sensor.

Figure 6:
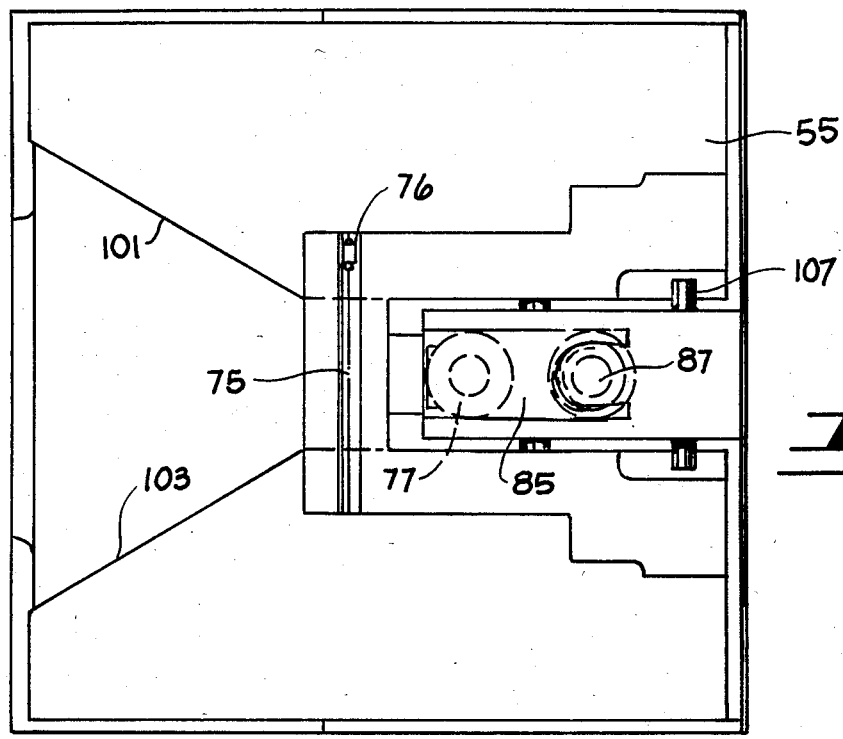
FIG. 6 is a top view of a wafer transfer station taken along lines 6—6 in FIG. 5.

FIG. 6 shows platform 55 having a forward notch defined by edges 101 and 103. The V-shaped space between these edge walls is void, permitting access by a wafer chuck into the lowermost portion of a wafer carrier. Such a carrier would have its location bar placed in the registration notch 75 and be sensed by a sensor, such as micro switch 76, then be raised and lowered on platform 55 by screw 87 acting on sleeve 85 which rides on shaft 77. Stopping post 107 partially limits upward motion of platform 55 as described with reference to FIG. 7.

Figure 7:
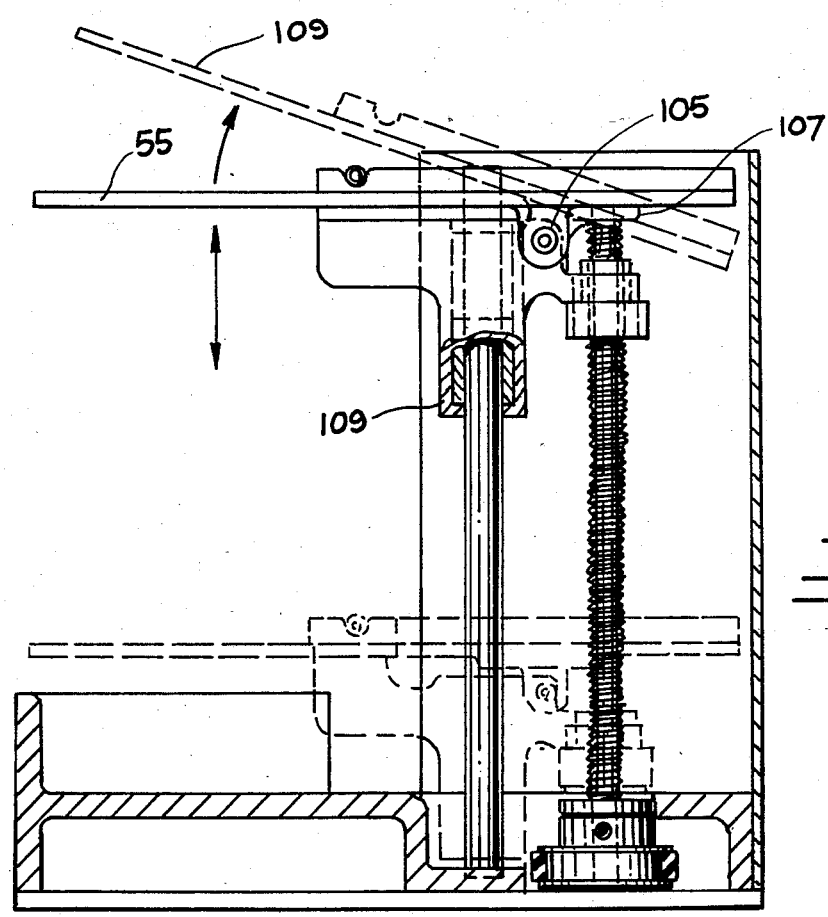
FIG. 7 is a side view of a wafer transfer station taken along lines 7—7 in FIG. 2.

FIG. 7 indicates the ability of platform 55 to rock back to the position indicated by the dashed lines 109 upon application of a tilting force. When a wafer carrier is grasped from a level platform, there is some risk that the wafers may fall out if there is any forward inclination in the lifting motion. To prevent such an accident, a tilting motion exists in the platform of an elevator to provide extra safety. If wafers were to fall from a carrier, there is a risk of permanent damage and at a minimum, a need for thorough cleaning, a time-consuming process. More importantly, the rearward tilt of the carrier serves to index or register the position of the wafers at a known location. Platform 55 is hinged by means of a screw and bushing combination 105. A tilting force is applied by overdriving sleeve 85 against a specially provided stopping post 107. Screw and bushing 105 are provided to allow rotation of platform 55 to an angle of between 10–30 degrees. Such rotation of the platform to the position indicated by dashed lines 109 causes a similar rocking back of a wafer carrier on top of the platform. All wafers in the carrier will be pushed rearwardly in the carrier such that each wafer is fully entrant in its respective notch or groove. Thus, the position of each wafer is automatically established. When wafers are removed from the carrier, the wafer chuck enters the V-shaped space described below, just below a wafer such that a wafer drops onto the rear of the chuck at a one degree angle and then continues onto the front of the chuck.

In FIG. 8, a curved track section 61 is shown to be connected to elevator stand 113, inwardly of the previously described lip, indicated by dashed line 114. The curved track section includes a plate 115 having a curved groove 117 which defines the intended trajectory for a horizontally disposed wheel associated with the track follower 63. Groove 117 has uniform width and depth, giving the track a U-shaped cross section. Plate 115 is anchored to elevator stand 113 by means of a pivot 119. The track section is moved in and out of the path of wheel 65, associated with track follower 63 by means of a linear motor 120, mounted on stand 113. The linear motor drives arm 121 in the direction indicated by arrows D, pushing and pulling forward end 123 of the curved track section from a position intercepting wheel 65 as the carriage approaches a wafer transfer station to a second position indicated by dashed lines 125 wherein the curved track section will not intercept wheel 65 and the upright arm will bypass the wafer transfer station. The motion of arm 121, causing the curved track section 61 to intercept or not intercept wheel 65 resembles the switching of railroad siding tracks into and out of a rail path.

Placement of the curved track section 61 is not limited to one particular side of the wafer path. A second curved track section 127 may be associated with an elevator stand 129 which is part of another wafer transfer station, on the opposite side of the wafer path from elevator stand 113. The second curved track section 127 may also be interposed in the path of the track follower by means of a linear motor 131 which will push the second curved track section 127 and rotate it about pivot 133. Only one curved track section can intercept the wheel and so the motors 120 and 131 must cooperate with each other so that only one may be extended at a time in a position to cause a curved track section to intercept wheel 65. Similarly, if more than two curved track sections are used, all motors should have curved track sections retracted, allowing the wheel 65 to go past the curved track sections to reach a single intended track section whose motor arm has extended the position of the section to intercept the wheel. As soon as an operation is complete, that track section may have its position retracted until the wheel 65 is near the position of another wafer transfer station having a curved track section which is now extended.

FIGS. 9 and 10 illustrate forward motion of a carriage 19, powered by belt 25 with a wafer chuck 11 supported by boom 13. Curved track section 61 has been extended by motor 120 such that the track follower member beneath the boom 13 will have its wheel engage the groove in the curved track section 61 and follow arrow E. The remaining curved track sections 135 and 137 remain retracted. As the wheel on the track follower member engages the curved track section 61, boom 13 rotates, allowing wafer chuck 11 to access a wafer in a wafer tray supported on platform 55. Vacuum is applied to the chuck as the wafer carrier is lowered so that a wafer can be clamped in place and then the carriage is backed up causing a reversal of the prior motion of the boom 13 so that the boom is once again aligned parallel to rails 21 and 23. The curved track section 61 is then retracted so that the carriage can move forward, past the wafer transfer station 55, if desired, to a work or measurement station and thereafter to one of the four shown wafer transfer stations. Usually a plurality of stations, such as stations 55, 141, 143 and 145, wafers may be manipulated, sorted, or removed and replaced in the same or different carriers. Such removal frequently occurs in testing and wafer fabrication processes. The present invention allows wafer handling over extended distances without human contact which can cause damage to wafers, and thus presents an undesirable handling risk, and without particle contamination from sources associated with belts and air tracks, yet with greater precision and with preservation of wafer orientation.

We claim:

1. A wafer and disk handling apparatus comprising,
   a wafer chuck mounted on a horizontally extending boom capable of rotating about a vertical axis, said wafer chuck capable of supporting a wafer in a releasable manner, said boom normally oriented in a first direction by means of a biasing element,
   an upright arm supporting said boom along said vertical axis of rotation, said boom supported at a first position along the length of the arm,
   guide means connected to the upright arm at a second position along the length of the arm for turning said arm to a plurality of directions,
   carriage means movable along a predefined path for supporting the upright arm,
   means associated with said predefined path for actuating said guide means at selected locations along the path, for selectively causing said turning of said arm,
   motor means for moving said carriage means past said selected locations, and
   a wafer elevator disposed adjacent to said predefined path, said elevator having means for supporting a spaced wafer stack at an elevation for wafer transfer with said wafer chuck.

2. The apparatus of claim 1 wherein said wafer chuck is a vacuum chuck having a vacuum line running through said boom.

3. The apparatus of claim 1 wherein said path is defined by opposed rails spaced on either side of said carriage means, said carriage means having support members contacting said rails.

4. A wafer and disk handling apparatus comprising,
   a wafer chuck mounted on a boom capable of rotating about a vertical axis, said wafer chuck capable of supporting a wafer in a releasable manner, said boom normally oriented in a first direction by means of a biasing element, an upright arm supporting said boom along said vertical axis of rotation, said boom supported at a first position along the length of the arm, carriage means movable along a predefined path for supporting the upright arm, curved track and follower means connected to the upright arm for turning said arm to a plurality of different directions, means associated with said predefined path for actuating said curved track and follower means at selected locations along said path for selectively causing said turning of said arm, motor means for moving said carriage means past said selected locations and a wafer elevator disposed adjacent to said path, said elevator having means for supporting a spaced wafer stack at an elevation for wafer transfer with said wafer chuck, said wafer elevator associated with said curved track and follower means.

5. The apparatus of claim 4 wherein said wafer elevator is hinged for rocking back, relative to the horizontal.

6. The apparatus of claim 4 wherein a plurality of said wafer elevators is disposed adjacent to said path, each elevator being associated with a curved track and follower means whereby boom and arm rotation may selectively occur near each elevator by actuating an associated one of said curved track and follower means.

7. The apparatus of claim 6 wherein a first number of said plurality of wafer elevators are disposed on one side of said path and a second number of said plurality are disposed on an opposite side of said path.

8. The apparatus of claim 4 wherein said motor means includes a first pulley at one end of said path, a second pulley at an opposite end of the path and a belt trained about the pulleys, said belt connected to said carriage for transferring motive power, one of said pulleys being driven by a motor.

9. The apparatus of claim 4 wherein said curved track and follower means includes a track having a U-shaped cross section and a track follower including an arm and a wheel, said wheel fitting within said track.

10. A wafer or disk handling apparatus comprising, a vacuum chuck supported by an upright arm over a movable carriage, the carriage supported for motion on a fixed path, said arm having an axis of rotation perpendicular to said path, said path having selectable curved track sections which may be selectively positioned in and out of said path, said arm connected to a track follower, said track follower slidable on said curved track sections, whereby motion of the track follower on said curved track causes rotation of said arm about said axis.

11. A wafer and disk handling apparatus comprising, a pair of spaced apart parallel rails defining a path for wafer movement, a carriage disposed for motion on said rails, said carriage mounting a rotatable upright arm and a boom connected to the arm, said arm having means for extending the boom in a direction parallel to said rails, said boom having a wafer clamping means at the end thereof, a wafer elevator disposed alongside one of said parallel rails, the wafer elevator adapted for raising and lowering a wafer carrier, the wafer carrier having grooves for seating wafers, the wafer elevator having an entry for admitting said wafer clamping means below the lowermost wafer in said grooves, said wafer elevator further having track means for rotationally deflecting said upright arm upon command thereby swinging said boom from said direction parallel to said rails to a direction facing said wafer elevator, and motor means for providing motion to said carriage along said rails.

12. The apparatus of claim 11 wherein said track means for rotationally deflecting said upright arm comprises curved track sections having a groove therein for seating a track follower member associated with said rotatable upright arm, said curved track section movable into and out of the path of said carriage.

13. The apparatus of claim 11 wherein said wafer elevator has tilting means for rocking a wafer carrier rearwardly, thereby indexing the position of wafers held therein.

14. The apparatus of claim 11 wherein said wafer clamping means is a vacuum chuck.

15. The apparatus of claim 11 wherein said boom extends horizontally from a boom joining said arm at a joint.

* * * * *